United States Patent [19]
Eory

[11] Patent Number: 5,832,043
[45] Date of Patent: Nov. 3, 1998

[54] SYSTEM AND METHOD FOR MAINTAINING CONTINUOUS PHASE DURING UP/DOWN CONVERSION OF NEAR-ZERO HERTZ INTERMEDIATE FREQUENCIES

[75] Inventor: Frank Steven Eory, Chandler, Ariz.

[73] Assignee: Motorola, Inc., Schaumburg, Ill.

[21] Appl. No.: 416,122

[22] Filed: Apr. 3, 1995

[51] Int. Cl.$^6$ .............................. H03D 3/24; H04L 27/06
[52] U.S. Cl. .................. 375/344; 375/327; 375/375; 395/381; 395/421.04; 395/496; 364/948.34
[58] Field of Search ..................... 375/344, 350, 375/357, 376, 365, 366, 362, 327, 324, 340; 327/147, 156; 329/307, 345, 346, 304, 305; 364/948.34, 231.8, 964.26

[56] References Cited

U.S. PATENT DOCUMENTS

| | | | |
|---|---|---|---|
| 4,916,405 | 4/1990 | Keate et al. ............................. | 329/308 |
| 5,107,522 | 4/1992 | Kitayama et al. ...................... | 375/344 |
| 5,113,416 | 5/1992 | Lindell .................................... | 375/344 |
| 5,287,388 | 2/1994 | Ogura et al. ............................. | 375/344 |
| 5,311,546 | 5/1994 | Paik et al. ................................ | 375/344 |
| 5,400,363 | 3/1995 | Waugh et al. ........................... | 375/344 |
| 5,402,449 | 3/1995 | Schultes et al. ......................... | 375/344 |

OTHER PUBLICATIONS

Francis Natol:, "AFC Tracking Algorithms", 1994 pp. 935–947.

*Primary Examiner*—Wellington Chin
*Assistant Examiner*—William Luthur
*Attorney, Agent, or Firm*—Kevin K. Johanson

[57] ABSTRACT

A digital rotating complex phasor generator (60) provides a constant magnitude continuous phase signal at either a positive or a negative frequency for translating the frequencies of a modulated signal from a near-zero intermediate frequency (IF) to baseband. The rotating complex phasor generator allows a digital receiver front-end to down-convert the received signal to an IF of substantially zero Hertz prior to analog to digital conversion, even in the presence of large Doppler frequency shifts and tuning uncertainties which may result in a residual IF carrier which has either a positive or a negative frequency.

10 Claims, 2 Drawing Sheets

SYSTEM AND METHOD FOR MAINTAINING CONTINUOUS PHASE DURING UP/DOWN CONVERSION OF NEAR-ZERO HERTZ INTERMEDIATE FREQUENCIES

FIELD OF THE INVENTION

The present invention relates to the field of digital communications and specifically to a high data rate digital radio receiver in which demodulation, synchronization and all baseband signal processing functions are performed by digital circuits. The present invention provides a digital apparatus and method for frequency up-conversion or down-conversion of a near-baseband modulated signal and is employed in digital frequency and phase synchronization loops.

BACKGROUND OF THE INVENTION

A radio receiver in which a substantial portion of the signal processing functions are performed by digital circuits can be described as a digital receiver. Digital receivers perform the same functions as receivers constructed from analog circuits, but offer greater signal processing flexibility, less unit to unit variations and reduced size and weight, through the use of Very Large Scale Integration (VLSI) techniques. Digital receivers are particularly advantageous in a digital communications system, in which the modulation signal is a sequence of binary pulses.

A typical digital receiver obtains a Radio Frequency (RF) signal from an antenna, performs low-noise amplification, filtering and frequency down-conversion in the RF front-end circuitry. The output of this front-end circuitry is quantized by an Analog to Digital Converter (A/D) and all remaining signal processing functions, including carrier frequency and phase tracking, data symbol clock recovery, gain correction, filtering and data detection are all performed with digital circuits.

In traditional superheterodyne radio receivers, frequency conversion from the transmitted RF to an Intermediate Frequency (IF) is accomplished by multiplying the RF signal by a sinusoidal Local Oscillator (LO) signal in an analog double-balanced mixer. To achieve channel selectivity, additional conversions from higher frequency IFs to lower frequency IFs may also be performed by providing additional double-balanced mixers and LO signals. This approach requires that the final IF be greater than the modulation bandwidth to prevent distortion induced by spectral overlap between the desired signal and the image signal. In digital communications, the modulation bandwidth is generally greater than or equal to the baud rate, and in a digital receiver, an A/D with an analog bandwidth greater than the final IF is required. This imposes a significant limitation on the information rate which can be supported by a high data rate digital receiver.

Purely analog receivers have inherent limitations on signal processing possibilities and are subject to thermal variations and aging effects and also pose challenges for manufacturing consistency and may require labor-intensive test and alignment. Digital receiver architectures were developed to overcome many of these shortcomings. The performance of a digital receiver is limited by the conversion speed and resolution of the A/D. Receiver architectures which make maximum use of existing A/D performance are required to maximize the data rate at which the digital receiver operates.

The restriction that the final IF be greater than the modulation bandwidth can be partially overcome by employing a quadrature down-converter to generate an In-Phase Channel (I channel) and a Quadrature Channel (Q channel) at the final IF. This eliminates the image signal and thus avoids spectral overlap. The I channel and Q channel signals can be interpreted as the real and imaginary components, respectively, of a complex signal R:

$$R = I + jQ$$

where j is the imaginary operator, equal to the square root of −1. The received complex signal R will rotate in the complex plane with a frequency $\omega_1$ and a phase offset $\phi_1$, where $\omega_1$ is the radian frequency of the residual IF carrier and $\phi_1$ is the phase offset of the received signal R with respect to the transmitted signal. With this technique, the final IF can in principle be reduced to zero Hertz, but from a practical standpoint it must be kept strictly positive or negative in prior art digital receivers.

Doppler shifts due to relative velocity between a transmitter and a receiver, tuning accuracy and drift of receiver LOs all contribute frequency uncertainty and the residual carrier frequency at the final IF may fluctuate between positive and negative frequencies, requiring the receiver to alternate between up-conversion and down-conversion to remove the residual carrier. This is particularly a concern in low Earth orbit satellite communication links, where Doppler shifts change polarity as the satellite passes over a ground-based transceiver and where the Doppler shifts can be a large percentage of the modulation bandwidth and the rate of change in Doppler can be substantial.

A digital receiver can support a final IF of substantially zero Hertz if a means is provided for generating digital quadrature LO signals which can alternate between positive and negative frequencies, as required, to either digitally up-convert or down-convert the signal and remove the residual carrier. These quadrature LO signals, which are digital representations of sine and cosine waveforms, can be interpreted as rectangular components of a rotating complex phasor, using Euler's relation:

$$e^{j(\omega 2 t + \phi 2)} = \cos(\omega_2 t + \phi_2) + j\sin(\omega_2 t + \phi_2)$$

where $\omega_2$ is the radian frequency of oscillation, which can be positive or negative, t is time and $\phi_2$ is an arbitrary phase. Since the representation is digital, $\omega_2$ and $\phi_2$ are quantized and t is discrete time, equal to nT, where n is the sample index and T is the sampling period. Frequency conversion to an IF of precisely zero Hertz is achieved when $\omega_2 = -\omega_1$. Phase synchronization is also achieved if $\phi_2 = -\phi_1$. In order to provide bi-directional frequency conversion without introducing significant signal distortion, the magnitude of the digital complex phasor must be constant and its phase must be continuous. The Numerically Controlled Oscillator (NCO) with quadrature outputs is well-known to those skilled in the art, is commercially available in Integrated Circuit (IC) form and meets all of these requirements except that it cannot generate negative frequencies.

The distinction between positive and negative frequencies, in the context of a rotating complex phasor, is that the phasor rotates counter-clockwise for a positive frequency and clockwise for a negative frequency. This can also be described by noting that the cosine leads the sine for positive frequencies, and vice-versa for negative frequencies. When the modulated signal with a residual carrier frequency is multiplied by this phasor in a complex multiplier, a single-sideband frequency conversion is achieved. A negative frequency phasor down-converts the signal and a positive frequency phasor up-converts the signal. Since the complex multiplier inherently provides single-sideband conversion, lowpass filtering of the baseband I and Q channel complex multiplier outputs is not required, as there are no unwanted frequencies to reject.

An approach to generating negative frequencies uses a NCO with quadrature outputs and negates the sine output when the NCO frequency control input is a negative-valued binary number in either 2's complement or sign and magnitude format. This forms the complex conjugate of the NCO output and has the effect of changing the direction of rotation of the complex phasor from counter-clockwise to clockwise. It does not, however, maintain continuous phase, except in the special case where the polarity reversal occurs at a zero crossing of the sine output. Phase discontinuities can be avoided by prohibiting the NCO from changing its direction of rotation until the next zero crossing of the sine waveform occurs. This, however, introduces a time lag in the phase/frequency tracking loop and can result in degraded loop performance or loop instability. Only the magnitude of the frequency word is coupled to the NCO, since it can only operate with unsigned (positive) frequency word inputs, and the sign bit is used to determine whether or not to negate the sine output. This approach therefore requires a frequency word with one additional bit of precision to achieve the same frequency resolution as a NCO which generates only positive frequencies.

Accordingly, there is a significant need to provide a digital rotating complex phasor generator which generates both positive and negative frequencies and maintains phase continuity when the direction of rotation is changed.

Also what is needed is a digital means for generating both positive and negative frequencies using the same number of bits of resolution in the digital frequency word and achieving the same frequency resolution as a NCO which generates only positive frequencies.

DESCRIPTION OF THE PREFERRED EMBODIMENT

Figure 1:
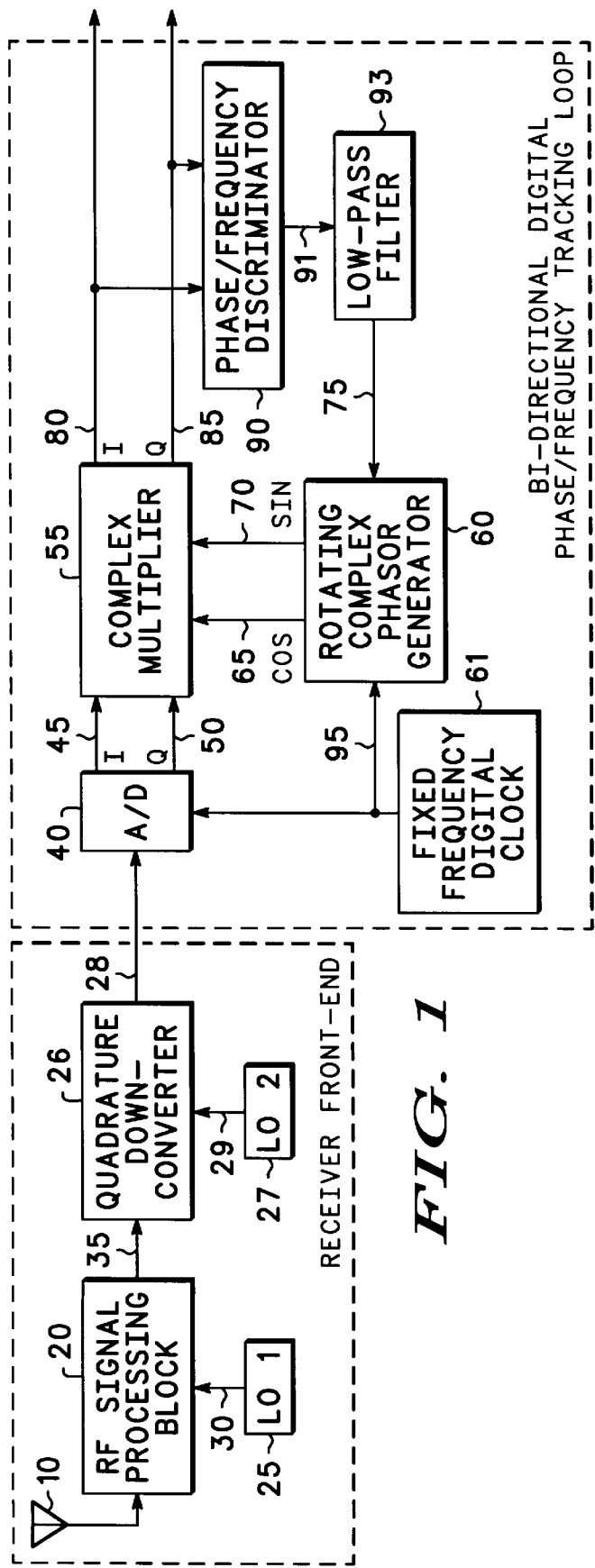
FIG. 1 illustrates a block diagram of an RF receiver in accordance with a preferred embodiment of the present invention.

FIG. 1 illustrates a block diagram of a the RF and IF processing sections of a substantially digital radio receiver in accordance with a preferred embodiment of the present invention. An antenna 10 for receiving RF signals is coupled to RF input terminals of an RF signal processing block 20, which comprises low-noise amplifiers, RF filters and mixers which pre-condition and down-convert the received signal. Output terminals of RF signal processing block 20 couple to input terminals of quadrature down-converter 26, which performs a single-sideband down-conversion to an IF of substantially zero Hertz. Implementations of RF signal processing block 20 and quadrature down-converter 26 are known in the art and particular implementations are not required for this invention. Antenna 10, RF signal processing block 20, quadrature down-converter 26, LO1 25 and LO2 27 constitute a receiver front-end.

Output terminals of LO1 25 are coupled to LO input terminals of RF signal processing block 20 and provide an LO1 frequency reference signal 30 for down-converting the received signal. Output terminals of LO2 generator 27 are coupled to LO input terminals of quadrature down-converter 26 and provide an LO2 frequency reference signal 29 for down-converting the IF signal 35. RF signal processing block 20 generally provides out-of-band rejection, low-noise amplification and frequency down-conversion of one or more channels or signal bands to a common IF. Channel selection is performed by tuning LO1 to a desired channel frequency and LO2 is normally set to a fixed frequency for all channels. It is known by those skilled in the art that RF signal processing block 20 may perform more than one frequency down-conversion. In that case, the LO1 block represents more than one frequency generator.

Near-zero IF signal 28 is input to A/D converter 40. A/D converter 40 includes amplification and level-shifting, as required, to provide an input signal of sufficient voltage amplitude to be effectively quantized. A/D converter 40 should be of sufficient resolution to support the requirements of subsequent baseband digital signal processing. The A/D converter resolution required is dependent upon the modulation format of the received signal and the allowable degradation from theoretical performance of the various loops and other signal processing functions in the digital receiver. A/D converter 40 generates digital samples of a near-zero IF in-phase channel data 45 and a near-zero IF quadrature channel data 50.

Digital complex multiplier 55 receives both the near-zero IF in-phase channel data 45 and the near-zero IF quadrature channel data 50 as one complex multiplicand. The desired output of complex multiplier 55 is baseband I channel and Q channel data from which any residual carrier signal has been removed. This residual carrier results from the combination of a Doppler shift in the transmitted signal, limited precision in tuning LO1 and LO2 frequencies and temperature and aging effects on the frequencies of LO1 and LO2.

Removal of the residual IF carrier requires that the near-zero IF complex signal represented by the near-zero IF in-phase channel data 45 and the near-zero IF quadrature channel data 50 be up-converted or down-converted to zero Hertz. This conversion or translation occurs by multiplying the near-zero IF complex signal by a rotating complex exponential function, $e^{j\omega t}$, which has a frequency equal and opposite to the residual IF carrier. This function can be described as a unit-length phasor in the complex plane which rotates with angular frequency $\omega$. Its phase angle with respect to the real axis traverses from 0 to $2\pi$ over one revolution. Positive frequencies are associated with counter-clockwise rotation and negative frequencies are associated with clockwise rotation. To achieve continuous phase when changing the direction of rotation, the phasor must stop and reverse direction.

Digital rotating complex phasor generator 60 generates cosine signal 65 and sine signal 70, which form a complex multiplicand and are the real and imaginary parts, respectively, of a complex rotating phasor required to remove residual IF carrier of a modulated signal from a near-zero IF complex modulated signal. Rotating complex phasor generator 60 responds to frequency word 75, which is output from a digital low-pass filter 93. A fixed frequency digital clock 61 has a clock output 95 which is coupled to clock input terminals of A/D converter 40, rotating complex phasor generator 60 and all other digital processing blocks which contain sequential elements. In high data rate applications, most of the digital signal processing blocks will contain sequential elements to support pipelined operation, including complex multiplier 55, phase/frequency discriminator 90 and digital low-pass filter 93.

Digital low-pass filter 93 operates on the phase/frequency error signal 91 to generate a frequency word 75 which changes over time, as necessary, to maintain frequency and phase lock. The inputs of phase/frequency discriminator 90 are coupled to baseband in-phase channel data 80 and baseband quadrature channel data 85 outputs of complex multiplier 55. The phase/frequency error signal 91 represents the instantaneous value of the frequency error and phase error in the baseband in-phase channel data 80 and baseband quadrature channel data 85. The combination of complex multiplier 55, phase/frequency discriminator 90, digital low-pass filter 93 and rotating complex phasor generator 60 comprise a Digital Phase-Locked Loop (DPLL) which is suitable for VLSI circuit implementation. Various implementations of phase/frequency discriminator 90 and digital low-pass filter 93 are known in the art and particular implementations are not required for this invention.

Those skilled in the art will appreciate that the phase/frequency discriminator 90 may be replaced with a frequency discriminator. In that case, the loop is described as a digital frequency tracking loop, which removes the residual IF carrier from the received signal but does not achieve phase synchronization. This implementation may be preferred in applications in which wide-band frequency tracking is desired and narrow-band phase tracking is performed by a separate phase tracking loop. The present invention is compatible with both the DPLL and the digital frequency tracking loop architectures.

Figure 2:
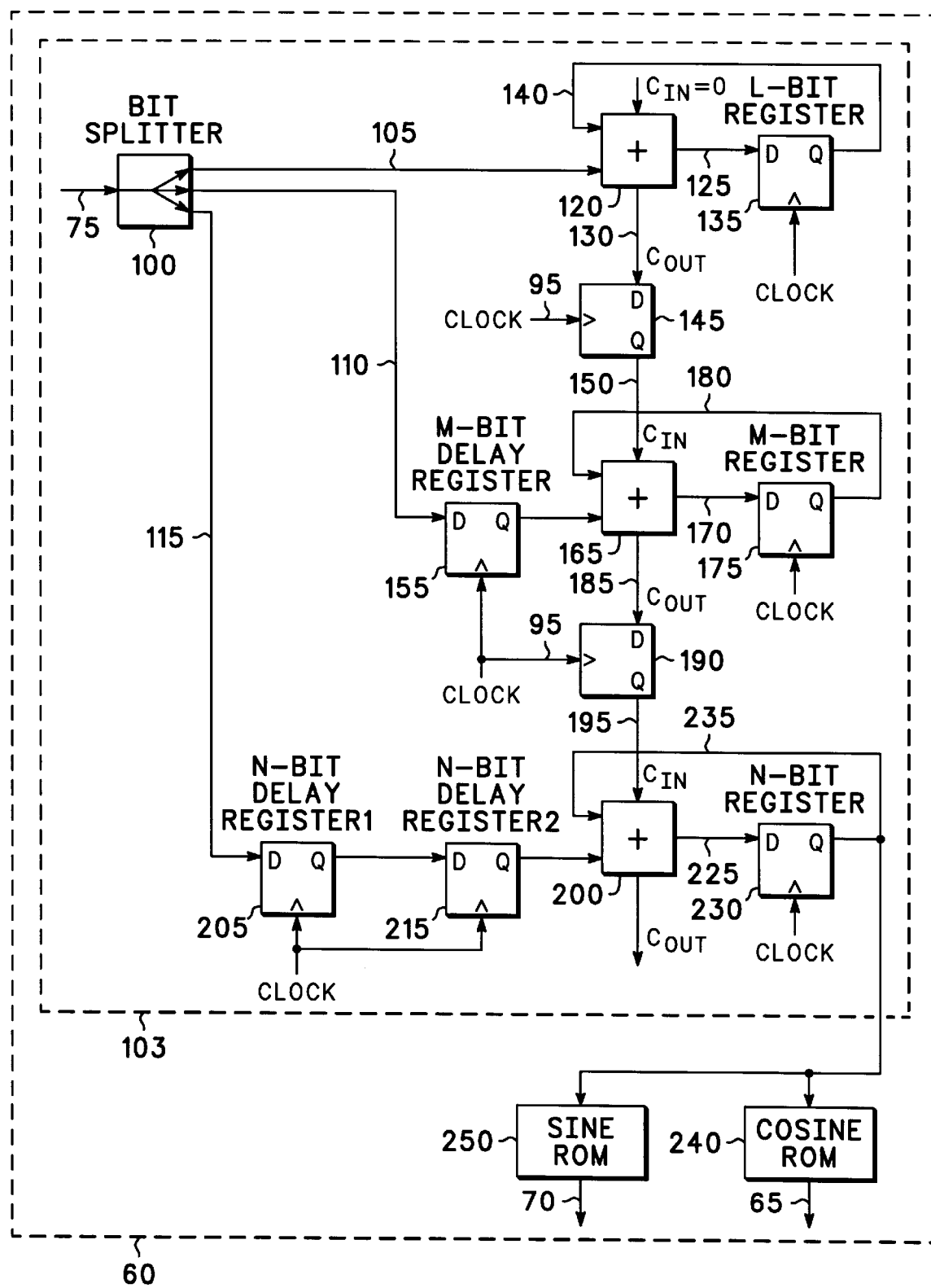
FIG. 2 illustrates a detailed block diagram of a digital rotating complex phasor generator in accordance with a preferred embodiment of the present invention.

FIG. 2 illustrates a detailed block diagram of a rotating complex phasor generator in accordance with a preferred embodiment of the present invention. In a preferred embodiment, frequency word 75 is a P-bit word where P=L+M+N and where L, M, and N are of lengths equivalent to the size of each of the stages in the pipelined architecture of a preferred embodiment.

Since a residual IF carrier may be positive or negative, the frequency word 75 must be a two's complement number. Bi-directional phase accumulator 103 interprets the frequency word as an unsigned number. The frequency word represents both the magnitude and the polarity of the phase step used by bi-directional phase accumulator 103. As the frequency word increases in magnitude, the magnitude of the phase step applied at each clock cycle is increased and the frequency of rotation of the complex phasor increases in magnitude. This is the case for both negative and positive frequencies.

The frequency resolution of bi-directional phase accumulator 103 is determined by the frequency word length, P bits, and the digital clock frequency:

$$f_{res} = \pm f_{CLK} 2/^P$$

where $f_{res}$ is the weight, in Hertz, of the least significant bit of the frequency word and $f_{clk}$ is the digital clock frequency in Hertz. The frequency of rotation of the output complex phasor is given by:

$$f_{out} = f_{word} f_{CLK} 2/^P$$

where $f_{word}$ is the two's complement frequency word.

The bus carrying frequency word 75 is a P-bit bus which is partitioned by bit splitter 100 into a frequency word bus L 105, frequency word bus M 110 and frequency word bus N 115.

Frequency word bus L 105 transfers L-bits of a P-bit frequency word to the L-bit stage of bi-directional phase accumulator 103. This L-bit stage comprises L-bit full adder 120 with L-bit sum 125 being latched by L-bit register 135. L-bit register 135 produces L-bit latched sum 140 as an addend for L-bit full adder 120. System clock 95 synchronizes the staging and pipelining process of bi-directional phase accumulator 103.

The pipelined bi-directional phase accumulator of the preferred embodiment uses unsigned full adders with carry propagation. Unsigned binary addition, when applied to partitioned two's complement addends, produces a carry output which occurs at the desired boundaries, so that the overall phase accumulator is modulo $2^P$ where P is the length in bits of the frequency word. This bi-directional phase accumulator also has the property that when the frequency word changes polarity, the phase accumulator reverses direction and maintains phase continuity.

Frequency word bus M 110 transfers M-bits of a P-bit frequency word to M-bit delay register 155. M-bit delay register 155 delays the M-bits of the frequency word while L-stage carry-out 130 is calculated and latched by L-stage pipeline latch 145. L-stage latched carry-out 150 then becomes the carry-in value for the M-stage. This M-bit stage comprises M-bit full adder 165 with M-bit sum 170 being latched by M-bit register 175. M-bit register 175 produces M-bit latched sum 180 as an addend for M-bit full adder 165. System clock 95 synchronizes the staging and pipelining process of bi-directional phase accumulator 103.

Frequency word bus N 115 transfers N-bits of a P-bit frequency word to N-bit delay registers 205 and 215. N-bit delay registers 205 and 215 delay the N-bits of the frequency word while L-stage carry-out 130 and M-stage carry-out 185 are calculated and latched. M-stage latched carry-out 195 then becomes the carry-in value for the N-stage. This N-bit stage comprises N-bit full adder 200 with N-bit sum 225 being latched by N-bit register 230. N-bit register 230 produces N-bit latched sum 235 as an addend for N-bit full adder 200. System clock 95 synchronizes the staging and pipelining process of bi-directional phase accumulator 103.

N-bit latched sum 235 functions as the address for cosine Read-only Memory (ROM) 240 and sine ROM 250 containing addressable discrete amplitude values. Cosine ROM 240 generates discrete cosine signal 65 and sine ROM 250 generates discrete sine signal 70, which form the rectangular components of the rotating complex phasor. In the preferred embodiment, both are used in the complex multiplication illustrated in FIG. 1 with near-zero IF in-phase channel data 45 and near-zero IF quadrature channel data 50 to produce baseband in-phase channel data 80 and baseband quadrature channel data 85 having zero hertz IF.

Figure 3:
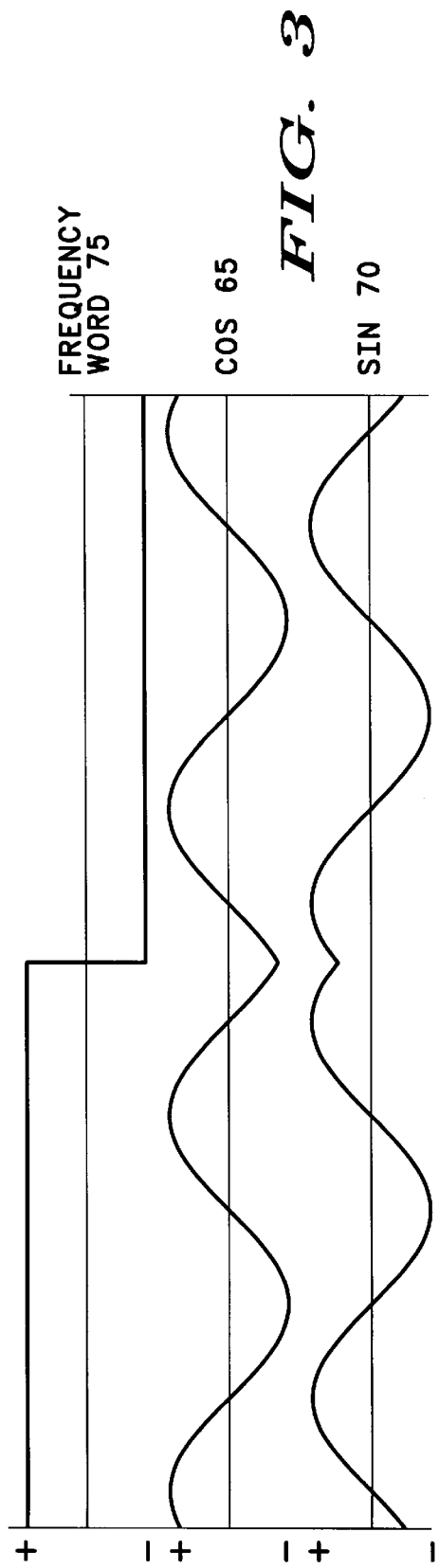
FIG. 3 illustrates the output of the digital rotating complex phasor generator in response to a change in the polarity of the input frequency word, in accordance with a preferred embodiment of the present invention.

FIG. 3 illustrates digital output signals of the rotating complex phasor generator in response to the input frequency word changing from a positive to a negative value, in accordance with a preferred embodiment of the present invention. When frequency word 75 has a positive value, cosine signal 65 leads sine signal 70 in time. When cosine signal 65 and sine signal 70 are expressed in polar form, they form a complex phasor rotating in a counter-clockwise direction in the complex plane. As frequency word 75 transitions from a positive value to a negative value as shown in FIG. 3, sine signal 70 begins to lead cosine signal 65. In polar form, the rotating complex phasor instantaneously reverses direction and begins rotating in a clockwise direction in the complex plane. When expressed in polar form, cosine signal 65 and sine signal 70 in FIG. 3 exhibit constant magnitude and continuous phase before, during and after the transition from positive to negative frequency.

It should be noted from FIG. 3 that digital rotating complex phasor generator 60 overcomes earlier shortcomings associated with generating negative frequencies using complex conjugates which either yielded discontinuities in sine signal 70 or required the introduction of an additional time lag in the loop, so that the direction of rotation was allowed to change only at a zero crossing of sine signal 70. Digital rotating complex phasor generator 60 provides positive and negative frequencies with continuous phase for accommodating bi-directional frequency conversion in near-zero IF digital receivers. Digital rotating complex phasor generator 60 also achieves greater frequency resolution than the prior art complex conjugate approach for the same number of bits in a frequency word.

Although the preferred embodiment of this invention has been illustrated, it will be readily apparent to those skilled in the art that various modifications may be made without departing from the spirit of the invention or from the scope of the appended claims. First, it will be readily apparent to those skilled in the art that the three-stage pipelining described can be extended to any number of stages. Operation at higher digital clock frequencies will generally require additional pipelining stages. Second, it will also be apparent to those skilled in the art that sine and cosine ROMs need not include a full cycle of amplitude values covering the range of 0 to $2\pi$ radians of phase. The techniques of storing only a quadrant of values (0 to $\pi/2$) or an octant of values (0 to $\pi/4$) and employing additional logic to generate full cycles of sine and cosine waveforms are well-known in the art and can be applied to implementations of the present invention.

It will be appreciated by those skilled in the art that the present invention allows receiver front-ends to down-convert RF signals to near-zero IF without the burdening restriction of requiring the IF to be positive. As noted earlier, this is complicated in the presence of Doppler frequencies generated by relative motion between the transmitter and receiver, particularly in low-Earth orbit satellite communication systems, where large Doppler frequencies are introduced.

What is claimed is:

1. A digital rotating complex phasor generator for generating a complex multiplicand in response to receipt of a frequency word to translate frequencies of a modulated signal up or down in frequency from an Intermediate Frequency, IF, of substantially zero Hertz to baseband, comprising:
    a cosine ROM having addressable discrete amplitude values defining discrete sinusoidal amplitude values varying with phase;
    a sine ROM having addressable discrete amplitude values defining discrete sinusoidal amplitude values varying with phase; and
    a bi-directional phase accumulator coupled to said cosine ROM and said sine ROM for generating phase-continuity addressing of said cosine ROM and said sine ROM, said bi-directional phase accumulator for providing a continuous phase output when transitioning between positive and negative IF frequencies and using said frequency word in two's complement format to determine said phase-continuity addressing for said IF being either positive or negative.

2. The digital rotating complex phasor generator as recited in claim 1, wherein said bi-directional phase accumulator comprises:
    a plurality of pipelined stages of accumulators for generating said phase-continuity addressing of said cosine ROM and said sine ROM;
    a bit splitter for partitioning said frequency word according to said plurality of pipelined stages of accumulators;
    a plurality of registers for delaying and synchronizing said plurality of pipelined stages of accumulators; and
    a clock output for synchronizing said plurality of pipelined stages of accumulators and said plurality of registers.

3. The bi-directional phase accumulator, as recited in claim 2, wherein each of said plurality of pipelined stages of accumulators comprises:
    an unsigned full adder for generating a sum output, and a carry output for each of said plurality of pipelined stages of accumulators;
    a register for storing said sum output of said unsigned full adder; and
    a latch for storing said carry output of each of said plurality of pipelined stages of accumulators.

4. A digital phase-locked loop for bi-directional frequency conversion with phase-continuity for translating near-zero IF signals having either a positive IF or a negative IF, comprising:
    an A/D converter for quantizing said near-zero IF signals, said A/D converter generating near-zero IF in-phase channel data and a near-zero IF quadrature channel data;
    a digital rotating complex phasor generator for generating a complex phasor which rotates in a complex plane with phase-continuity in response to a frequency word representing either a positive frequency or a negative frequency, and for providing a continuous phase output when transitioning between said positive frequency and said negative frequency;
    a digital complex multiplier coupled to said A/D converter and said digital rotating complex phasor generator for multiplying said complex phasor with said near-zero IF in-phase channel data and said near-zero IV quadrature channel data, as quantized by said A/D converter, to yield a baseband in-phase channel data and a baseband quadrature channel data;
    a digital phase/frequency discriminator for generating an error signal from said baseband in-phase channel data and said baseband quadrature channel data, said error signal representing an instantaneous phase error and frequency error in said baseband in-phase channel data and said baseband quadrature channel data; and
    a digital low-pass filter for averaging samples of said error signal and for generating said frequency word.

5. The digital phase-locked loop, as recited in claim 4, wherein said digital rotating complex phasor generator comprises:
    a cosine ROM having cosine addressable discrete amplitude values defining discrete sinusoidal amplitude values varying with phase in response to phase-continuity addressing;
    a sine ROM having sine addressable discrete amplitude values defining discrete sinusoidal amplitude values varying with phase in response to said phase-continuity addressing; and
    a bi-directional phase accumulator for providing a continuous phase output for said phase-continuity addressing when transitioning between said frequency word representing said positive frequency and said negative frequency.

6. A digital frequency tracking loop capable of bi-directional frequency conversion with continuous phase for translating near-zero IF signals having positive or negative IF, comprising:

a digital rotating complex phasor generator for generating a complex phasor which rotates with either a positive frequency or a negative frequency with continuous phase in response to receipt of a frequency word, and for providing a continuous phase output when transitioning between said positive frequency and said negative frequency;

an A/D converter for quantizing said near-zero IF signals, said A/D converter generating near-zero IF in-phase channel data and a near-zero IF quadrature channel data;

a digital complex multiplier coupled to said A/D converter and said digital rotating complex phasor generator for multiplying said complex phasor with said near-zero IF in-phase channel data and said near-zero IF quadrature channel data, as quantized by said A/D converter, to yield a baseband in-phase channel data and a baseband quadrature channel data;

a digital frequency discriminator for generating an error signal which indicates a frequency error in said baseband in-phase channel data and said baseband quadrature channel data; and a digital low-pass filter for averaging samples of said error signal and for generating said frequency word.

7. The digital frequency tracking loop as recited in claim 6, wherein said digital rotating complex phasor generator comprises:

a cosine ROM having cosine addressable discrete amplitude values defining discrete sinusoidal amplitude values varying with phase in response to phase-continuity addressing;

a sine ROM having sine addressable discrete amplitude values defining discrete sinusoidal amplitude values varying with phase in response to said phase-continuity addressing; and a bi-directional phase accumulator for providing a continuous phase output for said phase-continuity addressing when transitioning between said frequency word representing said frequency and said positive frequency.

8. A method for generating rectangular components of a digital rotating complex phasor which rotates in a complex plane with either a positive frequency or a negative frequency and which maintains phase continuity, comprising the steps of:

receiving a frequency word in two's complement format denoting said positive or negative frequency of rotation;

splitting said frequency word into a plurality of pipelined stages of accumulators;

accumulating successive ones of said frequency word in said plurality of pipelined stages of accumulators, said accumulating step providing said phase-continuity when said frequency word denotes positive frequency or negative frequency and said accumulating step also providing a continuous phase output when transitioning between said positive frequency and said negative frequency;

generating a digital address from one of said plurality of pipelined stages of accumulators for accessing said cosine ROM and said sine ROM containing addressable discrete amplitude values;

addressing said cosine ROM and said sine ROM using said digital address; and outputting said addressable discrete amplitude values.

9. A method for removing a residual IF carrier from a near-zero IF signal having a positive or negative IF carrier frequency while maintaining phase-continuity, said method comprising the steps of;

quantizing said near-zero IF signal, generating a near-zero IF in-phase channel data and a near-zero IF quadrature channel data;

generating a cosine signal and a sine signal having phase-continuity from a frequency word in two's complement form, said cosine signal and said sine signal representing rectangular components of a rotating complex phasor having a frequency equal in magnitude and opposite in polarity to said residual IF carrier, said rotating complex phasor providing a continuous phase output when transitioning between said near-zero IF signal of positive frequency and negative frequency;

performing a complex multiplication using said near-zero IF in-phase channel data and said near-zero IF quadrature channel data with said cosine signal and said sine signal to yield a baseband in-phase channel data and a baseband quadrature channel data; and measuring said baseband in-phase channel data and said baseband quadrature channel data to determine said frequency word for use in said generating step.

10. The method for removing a residual IF carrier from a near-zero IF signal as recited in claim 9, wherein said measuring step further comprises the steps of:

generating a frequency error signal indicating said residual IF carrier in said baseband in-phase channel data and said baseband quadrature channel data; and generating said frequency word by calculating a time average of said frequency error signal.

* * * * *